Aug. 22, 1967 J. E. McGEOGH ETAL 3,337,817

HIGH RATIO FREQUENCY MULTIPLIER

Filed Jan. 27, 1965 2 Sheets-Sheet 1

INVENTORS
JAMES E. McGEOGH
GAROLD K. JENSEN

BY James D. Murray
[signature]
ATTORNEYS

HIGH RATIO FREQUENCY MULTIPLIER

Filed Jan. 27, 1965 2 Sheets-Sheet 2

INVENTORS
JAMES E. McGEOGH
GAROLD K. JENSEN

BY James G. Murray
R. A. Sciascia
ATTORNEYS 3,337,817
HIGH RATIO FREQUENCY MULTIPLIER
James E. McGeogh, Silver Spring, Md., and Garold K. Jensen, Pinecrest, Va., assignors to the United States of America as represented by the Secretary of the Navy
Filed Jan. 27, 1965, Ser. No. 428,595
7 Claims. (Cl. 331—158)

ABSTRACT OF THE DISCLOSURE

Harmonic generator for high ratio frequency multiplication. Input signal triggers monostable multivibrator to produce signal rich in desired harmonic. Desired harmonic of multivibrator signal drives, through a tuned amplifier, a tuned, high Q, crystal locked oscillator of modified Pierce type.

The invention described herein may be manufactured and used by or for the Government of the United States of America for governmental purposes without the payment of any royalties thereon or therefor.

The present invention relates to a harmonic generator or frequency multiplication system and more particularly to an electronic system which is crystal controlled and which functions to provide an output signal which is a very precise, high ratio frequency multiple of an input signal.

In the field of radar there has been an increasing need for electronic circuits or devices which will furnish precise signals that are extremely high multiples, or harmonics, of another signal. This other signal is usually basic to the radar set, such as the pulse repetition frequency or a reference oscillator frequency.

Several different methods have previously been widely used in obtaining higher order harmonic signals. One such prior method is to energize, by Class C drive, several tank and filter circuits tuned to produce different lower harmonic signals, such as the second or third, and then to multiply and heterodyne these lower harmonic signals to obtain, after further filtering, the higher harmonic signal desired. Depending upon the harmonic desired, many heterodyning stages are required. This method is extremely inefficient and requires complex circuitry. Another prior method used in obtaining higher order harmonic signals is to pass either a square wave or a saw tooth wave through an electrical system designed to filter out the desired component. This method provides extremely weak higher harmonic signals, since in the series expansion of such waves, the amplitude of the *n*th harmonic is proportional to $E/n$, where E is the amplitude of the fundamental frequency. In obtaining extremely high harmonics by this latter method, difficulty is also experienced in isolating the desired harmonic from neighboring harmonics because conventional tank circuits and filters are not customarily sufficiently narrow banded.

The general purpose of this invention is to provide a frequency multiplier which embraces all of the advantages of similarly employed prior art devices and possesses none of the aforedescribed disadvantages. To attain this, the present invention contemplates shaping the input signal, which is typically a synchronizing pulse, by a one shot multivibrator into a rectangular pulse of such a width as to be rich in the harmonic desired. This pulse energizes a pentode, the plate circuit of which is tuned to the desired frequency. The plate circuit of the pentode, in turn, drives a locked crystal controlled oscillator circuit, the output of which can be on the order of 600 times the input signal frequency.

Although the present invention was made in response to a need in the radar field, and shall be herein described in that environment, it will be instantly recognized that the invention is not so limited, but is rather of general utility and capable of providing precise, extremely high ratio frequency multiples of an input signal, without regard to the source of the input signal.

It is, therefore, an object of the present invention to provide an electronic circuit which is capable of precise, high ratio frequency multiplication.

Another object of the invention is to provide a crystal controlled electronic circuit which is capable of high ratio frequency multiplication.

Yet another object of the present invention is the provision of a crystal controlled electronic circuit which is capable of producing an output signal which is on the order of 600 times an input signal frequency.

Other objects and advantages of the invention will hereinafter become more fully apparent from the following description and the annexed drawings, which illustrate a preferred embodiment of the invention, and wherein.

Figure 1:
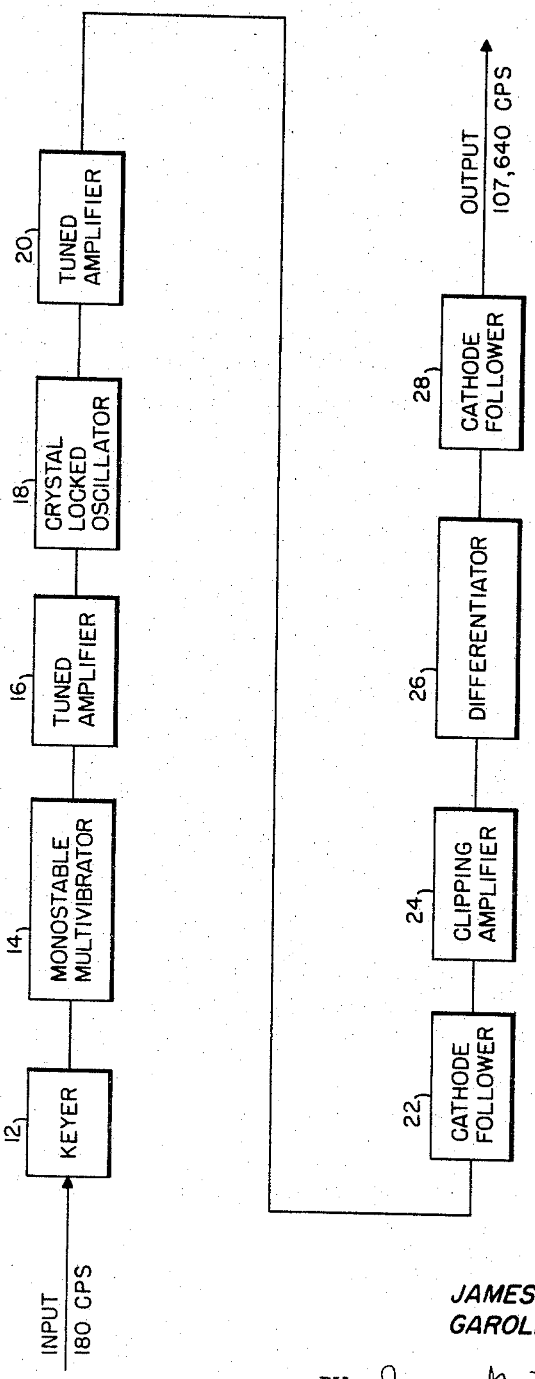
FIG. 1 is a block diagram of an embodiment of the invention.

Referring now to the drawings, wherein like reference characters designate like or corresponding parts, there is shown in FIG. 1 an embodiment of the invention in block diagram form. The input signal, which typically could be a 180 c.p.s. pulse repetition signal of a pulse type radar set, is applied to the keyer 12 which functions both to trigger monostable multivibrator 14 and to remove input signal noise and the accompanying risk of undesired, random triggering of multivibrator 14. The time constant of multivibrator 14 is chosen so as to produce an output pulse of such duration that a Fourier series expansion will include a comparatively large term in the desired harmonic. Tuned amplifier 16 is connected to multivibrator 14 and is tuned to amplify the desired harmonic component which is included in the pulsed output of the multivibrator. Because of component limitations, the pass band of tuned amplifier 16 is broad enough so that neighboring harmonics, as well as the desired harmonic, are included with significant magnitude in the amplifier output. This output is applied to crystal locked oscillator 18, the crystal of which is extremely frequency selective and rejects all but the desired harmonic. The output of oscillator 18 is a signal that is at the desired harmonic and, to very stringent tolerances, devoid of other harmonics. This signal, which typically can be at a frequency of 107,640 c.p.s., that is the 598th harmonic of the 180 c.p.s. input, is magnified in strength by tuned amplifier 20 and then can be shaped and impedance matched as desired by conventional circuitry such as cathode follower 22, clipping amplifier 24, differentiator 26 and cathode follower 28.

Figure 2:
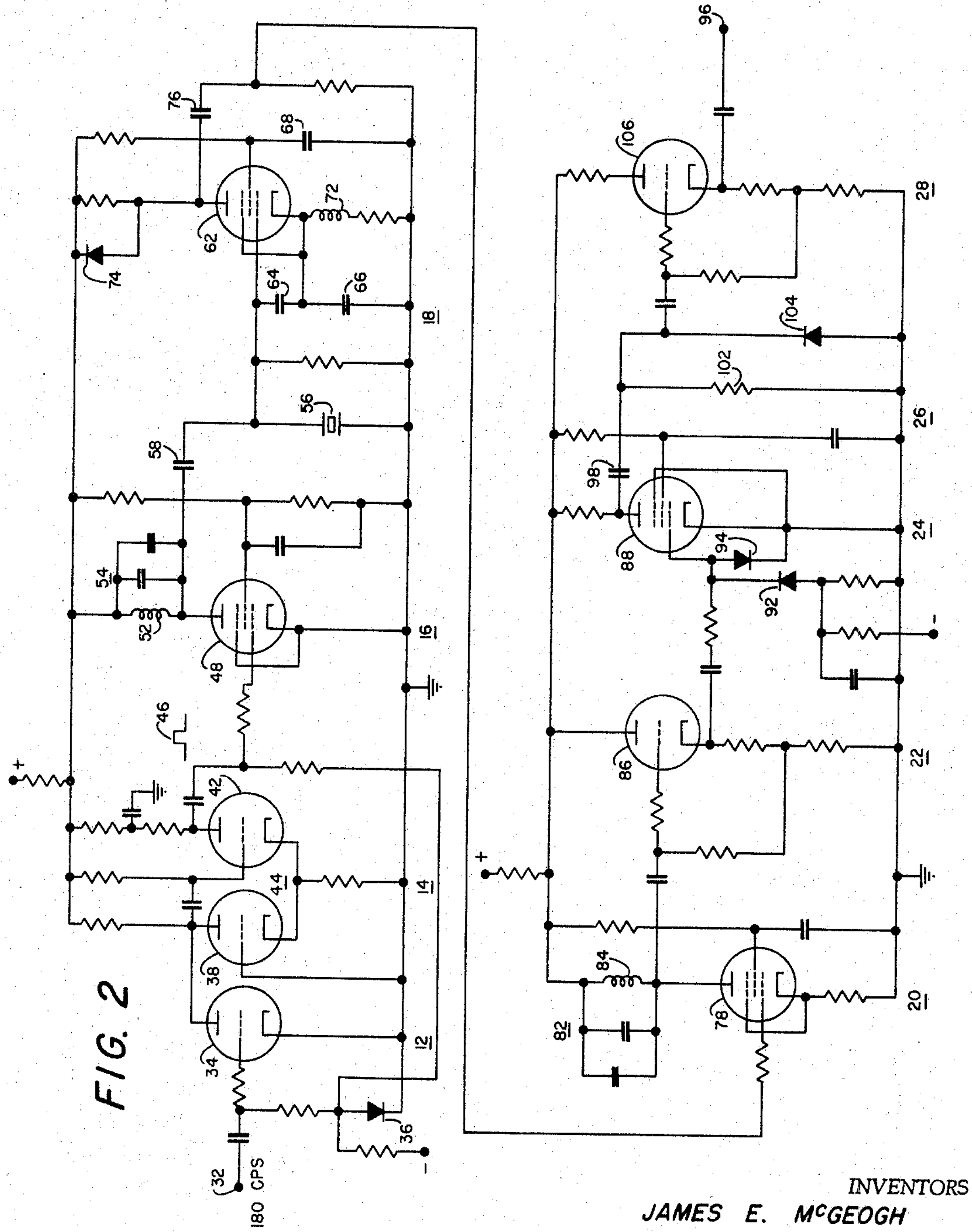
FIG. 2 is a circuit diagram of an embodiment of the invention.

FIG. 2 illustrates circuitry which is suitable for use in the embodiment of the invention described in relation to FIG. 1. Terminal 32 is connected to receive the input signal which, in conventional terminology, is at the fundamental frequency and typically can be a 180 c.p.s. positive pulse signal associated with the pulse repetition frequency of a radar set. The input signal is coupled by conventional circuitry to the grid of tube 34 which is biased by zener diode 36 to an operating point where low amplitude noise does not cause conduction in the tube. The plate of the first stage 38 and the grid of the second stage 42 of monostable multivibrator 44 are connected to receive the pulsed output of tube 34. Normally conducting stage 42 is cut off, and conduction established in normally non-conducting first stage 38 by the pulsed output of tube 34. The time constant of the conventional circuitry interconnecting the stages 38 and 42 is designed to cause the positive output pulse 46 of multivibrator 44 to be of a width, typically 3.5–4 microseconds, such that pulse 46 is rich in the desired frequency. Expressed slightly differently, the positive output pulse 46 of multivibrator 42 is of such a duration that the desired output frequency of the invention will appear as a term of significant magnitude in a Fourier series definition of pulse 46.

Zener diode 36 is also connected to establish the quiescent bias of pentode amplifier tube 48. Pulse 46 is also applied to tube 48, the plate circuit of which includes the high Q coil 52 connected in tank circuit 54 which is tuned to the desired frequency. Although circuit 54 includes quality conventional components, the pass band of such a circuit will not be so narrow as to exclude all of the undesired harmonics and in a typical example may include significantly sized components of the 597th and 599th harmonics, as well as the desired 598th harmonic. To further isolate the desired harmonic, typically considered to be the 598th, the invention contemplates the use of a crystal locked oscillator of the modified Pierce type.

As shown in FIG. 2, the output of tank circuit 54 is coupled to crystal 56 by capacitor 58. The design of these latter two components is critical to the optimum operation of the invention. Typically crystal 56 is a quartz structure fabricated to resonate at the desired harmonic frequency and to be extremely frequency selective, that is to have a Q in excess of 100,000. The size of capacitor 58, typically 1 pf., is chosen to couple crystal 56 to tank circuit 54 with a degree of looseness such that the crystal will not be driven by the undesired harmonic components contained in the output signal of the tank circuit but with sufficient coupling to "pull" the crystal so that it will follow very minor variations in the frequency of the input signal, for example, a variation of the input frequency to 179.95 c.p.s. In summary, the capacitor 58 and crystal 56 are functionally intended to produce a signal from which the neighboring harmonics of the desired harmonic are excluded but which will follow very minor variations in the frequency of the signal applied to input terminal 32.

Crystal 56 is one component of a modified Pierce type oscillator, incorporating pentode tube 62. This oscillator is designed to be tuned at the desired frequency and to have the necessary feedback, stability, etc. by suitably choosing, according to conventional good design practice, the components in the circuitry surrounding tube 62, and in particular capacitors 64, 66 and 68 and inductance 72. Zener diode 74, connected as illustrated in the plate circuit of tube 62, functions to uniformly limit the magnitude of the output signal pulses of tube 62. This signal, which is too weak to be useful for most purposes, is applied for amplification through coupling capacitor 76 to a tuned amplifier stage, the main component of which is pentode tube 78. The plate of tube 78 is connected to a tuned tank 82 which is tuned to the desired frequency and includes coil 84. The size of coupling capacitor 76 and the Q of coil 84, while not extremely critical, should be chosen so that there is no degradation of the frequency purity, that is an introduction of extraneous components, into the output signal of tube 62.

The plate signal output of tube 78 is connected to a cathode follower stage, the main component of which is tube 86. The purpose of this stage, the circuitry of which is entirely conventional, is to avoid loading the tube 78 and to provide a low impedance drive to subsequent loads or stages. The output of this cathode follower stage, which is substantially sinusoidal in form, may be of suitable strength and shape for many uses. Consequently it would be an obvious expedient to so use the cathode signal of tube 86. However, there are many instances where a square wave or a pulse drive are required and for this purpose the invention contemplates the use of additional stages of more or less conventional circuitry.

As illustrated in FIG. 2, the cathode of tube 86 is coupled to a squaring amplifier stage which includes pentode 88 and diodes 92 and 94. The differential bias between these diodes establishes the upper and lower levels of the square wave signal which is taken from the plate of tube 88. Although it is obvious that, if desired, this square wave could be used to drive a load not shown, the embodiment of the invention illustrated contemplates the provision of a spiked output at terminal 96. This is accomplished by using capacitor 98 and resistor 102 to differentiate the square wave signal taken from the plate of tube 88. The negative spike resulting from this differentiation is removed by diode 104 and the positive spike appears, after passing through the conventional cathode follower stage which includes tube 106, as the output signal at terminal 96. This output signal will be, with high precision, at the desired frequency multiple, typically the 598th harmonic or 107,640 c.p.s., of the frequency of the signal applied to input terminal 32.

In addition to the above described components, there have been included in FIG. 2 many components, the function of which will be obvious. In order not to burden the description, these components have not been explicitly identified.

It will be apparent that the circuit described in relation to FIG. 2 operates on an input signal to first remove noise and then to sequentially form a pulse rich in the harmonic desired, which harmonic is first amplified in a tuned amplifier and then purified, by removing neighboring harmonics, in a crystal locked oscillator and then amplified, shaped and matched to a load as dictated by the usage contemplated. The circuit is capable of producing an output signal which is on the order of 600 times the frequency of the input signal.

It should be understood, of course, that the foregoing description and numerical examples relate to only an embodiment of the invention and that numerous modifications or alterations may be made therein without departing from the spirit and the scope of the invention as set forth in the appended claims.

What is claimed and desired to be secured by Letters Patent of the United States is:

1. A high ratio frequency multiplication system for producing a desired harmonic signal of an input signal comprising:

wave producing means to receive said input signal and to produce a wave signal which includes a component of said desired harmonic frequency;

tuned amplifier means coupled to said wave producing means to receive said wave signal and to produce a mixed signal which includes said desired harmonic and neighboring harmonic frequencies and crystal controlled oscillator means coupled to said tuned amplifier means to receive said mixed signal and to produce an output signal consisting substantially solely of said desired harmonic frequency.

2. The high ratio frequency multiplication system set forth in claim 1 wherein said wave producing means includes:

keyer means connected to receive said input signal and to produce a keying signal which is representative of only the larger magnitude portions of said input signal and a monostable multivibrator connected to receive said keying signal and to produce said wave signal in the form of a rectangular pulse.

3. The high ratio frequency multiplication system set forth in claim 1 wherein said tuned amplifier means includes a plate tuned amplifier, the tank circuit of which is tuned to said desired harmonic frequency.

4. The high ratio frequency multiplication system set forth in claim 1 wherein said crystal controlled oscillator means is capacitively loosely coupled to the output of said tuned amplifier means.

5. The high ratio frequency multiplication system set forth in claim 4 wherein said crystal controlled oscillator means includes an extremely high Q crystal in controlling relation to a modified Pierce type oscillator.

6. The high ratio frequency multiplication system set forth in claim 1 wherein:

said wave producing means includes keyer means connected to receive said input signal and to produce a keying signal which is representative of only the larger magnitude portions of said input signal and a monostable multivibrator connected to receive said keying signal and to produce said wave signal in the form of a rectangular pulse;

said tuned amplifier means includes a plate tuned amplifier, the tank circuit of which is tuned to said desired harmonic frequency and said crystal controlled oscillator means is capacitively loosely coupled to the output of said tank circuit and includes an extremely high Q crystal in controlling relation to a modified Pierce type oscillator.

7. The high ratio frequency multiplication system set forth in claim 6 and further including wave shaping and impedance matching means coupled to receive said crystal controlled oscillator output signal for shaping said output signal and optimally driving a desired load.

References Cited

UNITED STATES PATENTS

| | | | |
|---|---|---|---|
| 2,442,612 | 6/1948 | Mynall | 331—166 |
| 2,454,132 | 11/1948 | Brown | 331—165 |
| 2,740,109 | 3/1956 | Okrent | 328—38 X |
| 2,768,299 | 10/1956 | Boff | 331—53 |
| 3,080,525 | 3/1963 | Davis | 328—38 |
| 3,204,196 | 8/1965 | Polizzi | 331—158 X |

ROY LAKE, *Primary Examiner.*

J. B. MULLINS, *Assistant Examiner.*